United States Patent
Wu

(10) Patent No.: US 6,437,364 B1
(45) Date of Patent: Aug. 20, 2002

(54) INTERNAL PROBE PADS FOR FAILURE ANALYSIS

(75) Inventor: Tsung-Chih Wu, Hsin-Chu (TW)

(73) Assignee: United Microelectronics Corp. (TW)

( * ) Notice: Subject to any disclaimer, the term of this patent is extended or adjusted under 35 U.S.C. 154(b) by 4 days.

(21) Appl. No.: 09/669,941

(22) Filed: Sep. 26, 2000

(51) Int. Cl.[7] .............................................. H01L 23/58
(52) U.S. Cl. ........................... 257/48; 438/14; 438/18; 438/48
(58) Field of Search ............................ 257/48; 438/11, 438/14, 15, 18

(56) References Cited

U.S. PATENT DOCUMENTS

| | | | | |
|---|---|---|---|---|
| 5,391,892 A | * | 2/1995 | Devereaux et al. | 257/48 |
| 5,623,214 A | * | 4/1997 | Pasiecznik, Jr. | 324/754 |
| 5,936,876 A | * | 8/1999 | Sugasawara | 365/51 |
| 6,094,056 A | * | 7/2000 | Bardsley et al. | 324/754 |
| 6,133,054 A | * | 10/2000 | Henson | 438/17 |
| 6,312,963 B1 | * | 11/2001 | Chou et al. | 438/18 |
| 6,323,048 B1 | * | 11/2001 | Chevallier | 438/14 |

* cited by examiner

*Primary Examiner*—Hoai V. Ho
*Assistant Examiner*—Andy Huynh
(74) *Attorney, Agent, or Firm*—Powell Goldstein Frazer & Murphy LLP

(57) ABSTRACT

The present invention relates to a device of internal probe pads used in failure analysis. The invention provides a circuitry which comprises a plurality of probe pads placed in the last metal layer of a die. Each probe pad is divided into several conductive regions, and each conductive region is selectively connected to one of the contacts of the internal circuitry within the die by interconnects. The circuitry within the die is placed into a mode by supplying signals to parts of the plurality of probe pads, wherein at least one probe pad is used to transmit the signals into the circuitry and another one of the probe pads is grounded.

11 Claims, 4 Drawing Sheets

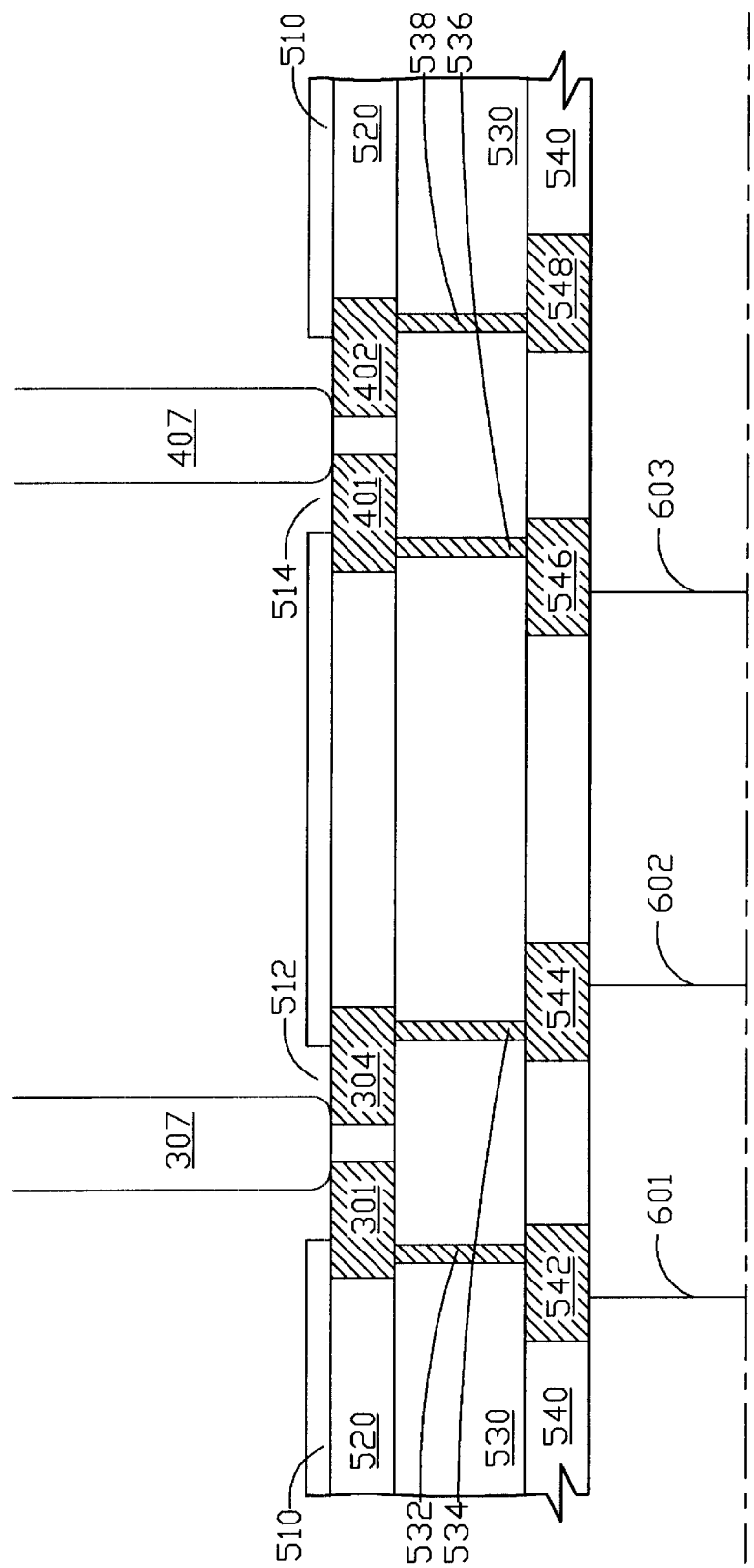

INTERNAL PROBE PADS FOR FAILURE ANALYSIS

BACKGROUND

1. Field of the Invention

The present invention generally relates to a device for semiconductor integrated circuits, and in particular to a device for internal probe pads.

2. Description of the Prior Art

Typically, Integrated Circuits have numerous contacts that provide interfaces between the circuits within the die and the outside world. The contacts are used for bond pads to which bond wires are connected. The bond wires are also connected to the lead frame. The contacts may be used for various signals including those for addressing, data(DQ), VCC(power), VSS(ground), and control. However, the contacts are extremely small or tiny. As such, it is impractical and expensive to provide direct connections between each of the contacts and probes used in testing, or repairing of the IC. Probe pads that are much larger than die contacts have been placed on, for example, the edge of the wafer. However, the sheer volume of contacts limits the number of contacts to which probe pads may be practically connected.

Failure analysis typically includes applying selected voltages to circuit inputs and examining selected output voltage levels, either through the use of a functional tester or a mechanical probing system. A mechanical probing system allows the failure analysis technician to apply probes to establish electrical connections to selected locations within the circuitry on a failed chip. However, this work is difficult and time consuming. The technician must visually locate the point of interest on the failed chip under a microscope, among thousands or millions of transistors and perhaps four or five layers of metal, and then manually position a probe at that point. Only a handful of probes can be applied using manual systems due to mechanical space limitations. The limited number of probes available limits the types of failure testing that can be accomplished in this manner.

An integrated circuit consists of electronic devices electrically coupled by interconnects. Interconnects are patterned from conductive layers formed on or above the surface of a silicon substrate. One or more conductive layers may be patterned to form one or more levels of interconnects vertically spaced from each other by one or more interlevel dielectric layers. Common materials for interlevel dielectric layers include silicon dioxide, silicon nitride, and polyimide. Dielectric-spaced interconnect levels allow formations of densely patterned devices on relatively small surface areas. Interconnects on different levels are commonly coupled electrically using via plugs formed in vias. Interconnect lines may be formed by stacking layers of various conductive materials on top of one another. Currently, such metal stacks commonly include titanium (Ti), aluminum (Al), copper (Cu), tungsten (W), and alloys of these metals.

In the prior art, a probe pad is connected to only one contact, so that it needs many probes to place the die into a certain mode. It is inconvenient to observe whether hot spots or emission spots occur in a die by a microscope while many probes are used. Especially in some packages, such as LOC (lead on chip), too many probes make the die more difficult to be tested.

SUMMARY

It is an object of the invention to reduce the number of probe pads which are used while a die is placed into a mode.

It is another object of the invention that a die can be placed to a mode by fewer probes.

It is still another object of the invention to make the observation of defects more convenient in failure analysis.

According to the foregoing objects, the present invention provides a circuitry within a die. The circuitry comprises a plurality of probe pads placed in the last metal layer of the die. Each probe pad is divided into several conductive regions, and each conductive region is selectively connected to one of the contacts of the internal circuitry within the die by interconnects. The circuitry can be placed into a mode by supplying a signal to at least one probe pad of the plurality of probe pads. In addition, a passivation layer may be deposited on the surface of the last metal layer. There are many openings formed in the passivation layer to explore these probe pads.

The present invention provides a method to place the circuitry within a die into a mode by internal probe pads. Firstly, a plurality of probe pads are formed in the last metal layer of a die. Each probe pad is divided into several conductive regions, and each conductive region is selectively connected to one of the contacts of the internal circuitry within the die by interconnects. Secondly, the circuitry within the die is placed into a mode by supplying signals to parts of the plurality of probe pads, wherein at least one probe pad is used to transmit the signals into the circuitry and another one of the probe pads is grounded.

The arrangement of probe pads on a die is not limited. The number of conductive regions in each probe pad is at least two. The shape and arrangement of conductive regions are also not restricted.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein:

FIG. 4A shows a cross-sectional view of an example of internal probe pads and interconnect in a die.

DESCRIPTION OF THE PREFERRED EMBODIMENT

Figure 1:
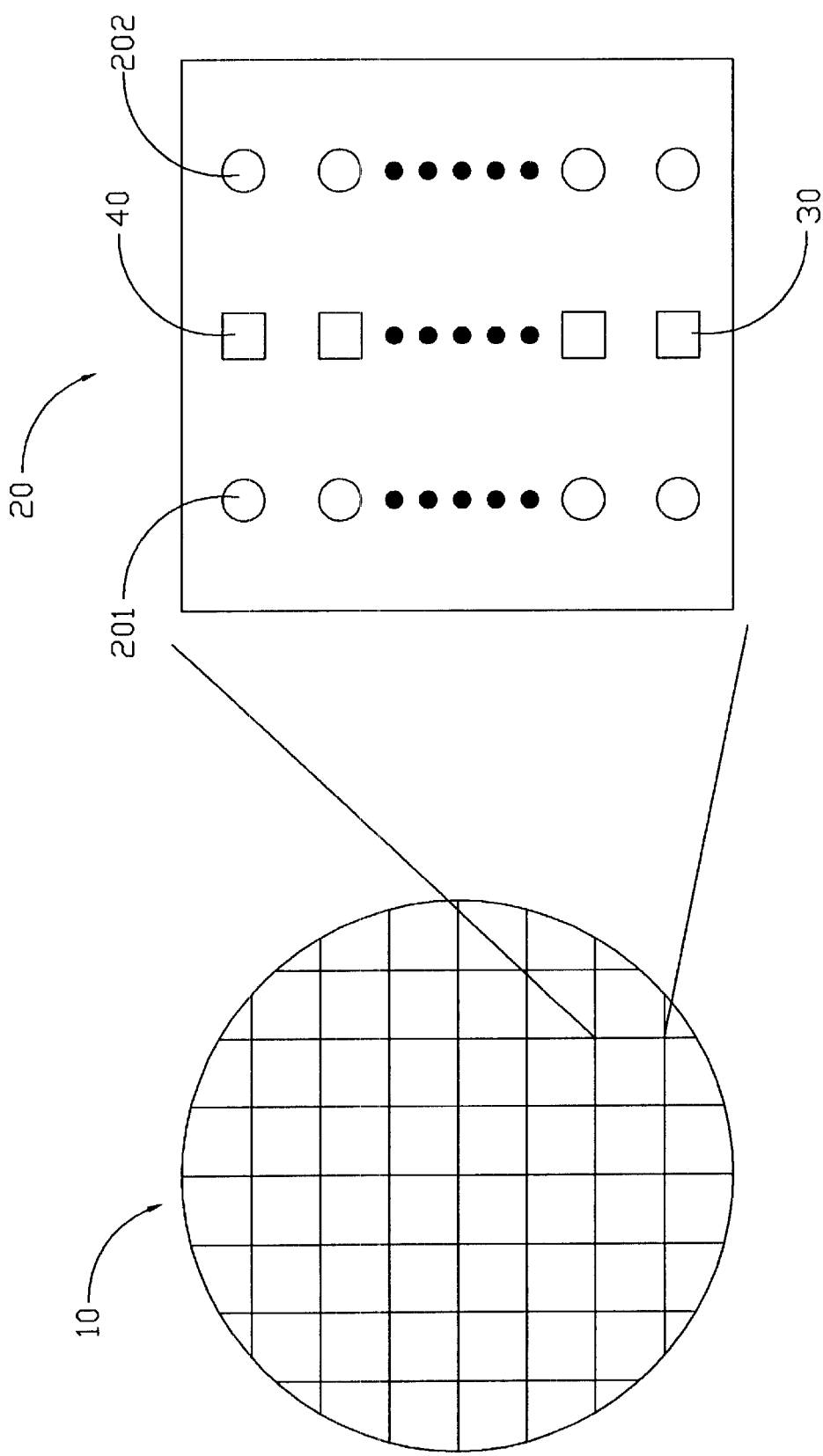
FIG. 1 show a schematic top view of a semiconductor wafer and dice.
Figure 2:
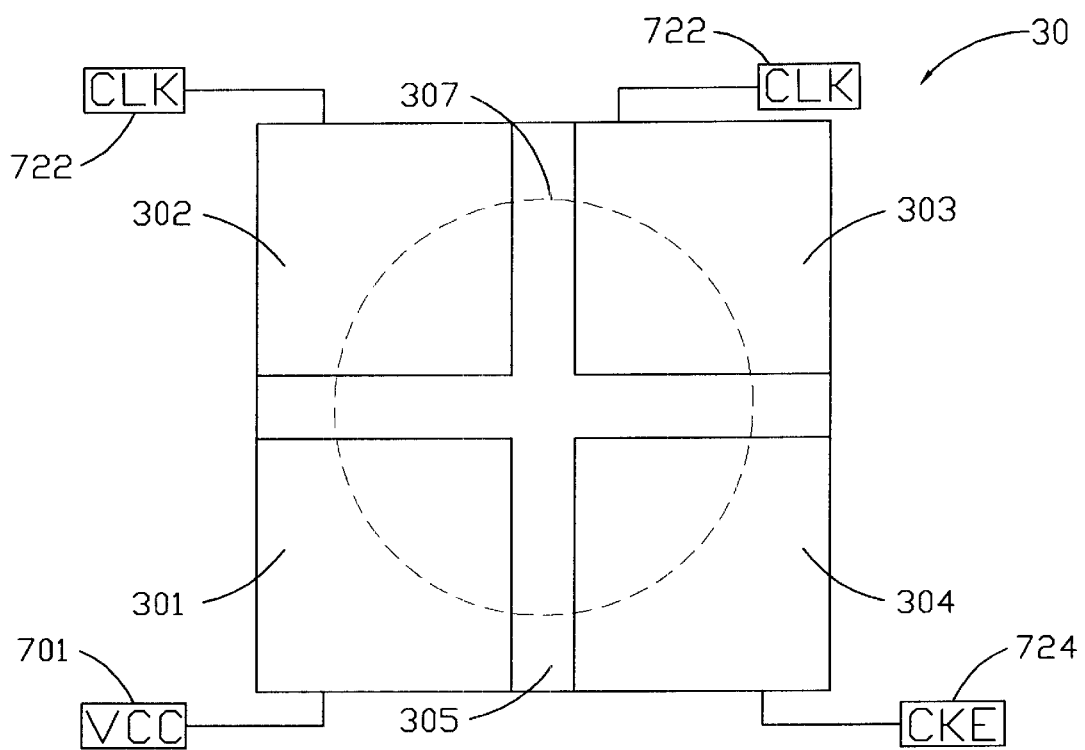
FIG. 2 shows a schematic top view of an example of internal probe pad with four conductive regions
Figure 3:
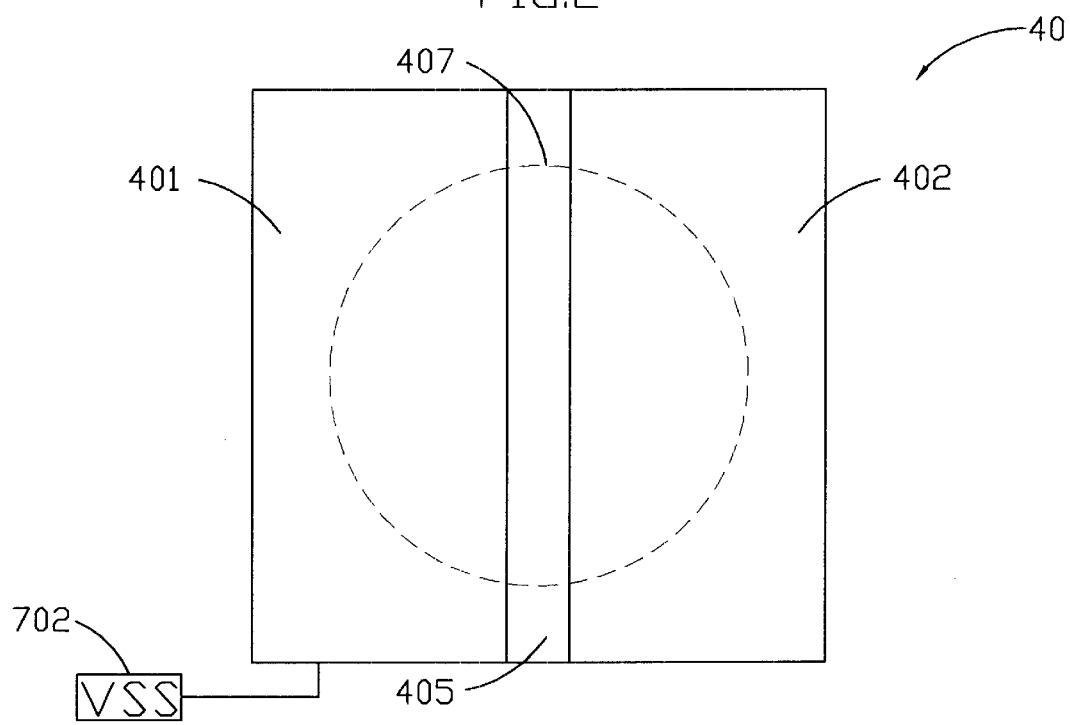
FIG. 3 shows a schematic top view of another example of internal probe pad with two conductive regions

In a preferred embodiment of the present invention, in addition to the bond pads 201,202 formed as art, there are internal probe pads 30 and 40 formed in the last metal layer of a die 20, as shown in FIG. 1. The first internal probe pad 30 is divided into four conductive regions 301 to 304, as shown in FIG. 2, each conductive region is connected to one of contacts of the internal circuitry 70 within the die 20 by interconnects and each conductive region is formed by etching. The first conductive region 301 is connected to the VCC contact 701, the second conductive region 302 is connected to the CLK (system clock) contact 722, the third conductive region 303 is also connected to the CLK contact 722, the fourth conductive region 304 is connected to the CKE (clock enable) contact 724, and these conductive regions are separated by space 305. While a first probe 307 is used to contact and supplies signals to the first probe pad 30, the signals are received through those four conductive regions to the internal circuitry 70. The second internal probe pad 40 is divided into two conductive regions, as shown in FIG.3. The fifth conductive region 401 is connected to the VSS contact 702 of the internal circuitry 70 within the die 20 by interconnects. The sixth conductive region 402 is free now, but it can be employed if necessary. These two conductive regions are separated by space 405. A second probe 407 is used to contact the second probe pad 40 to make the die 20 be grounded.

Figure 4B:
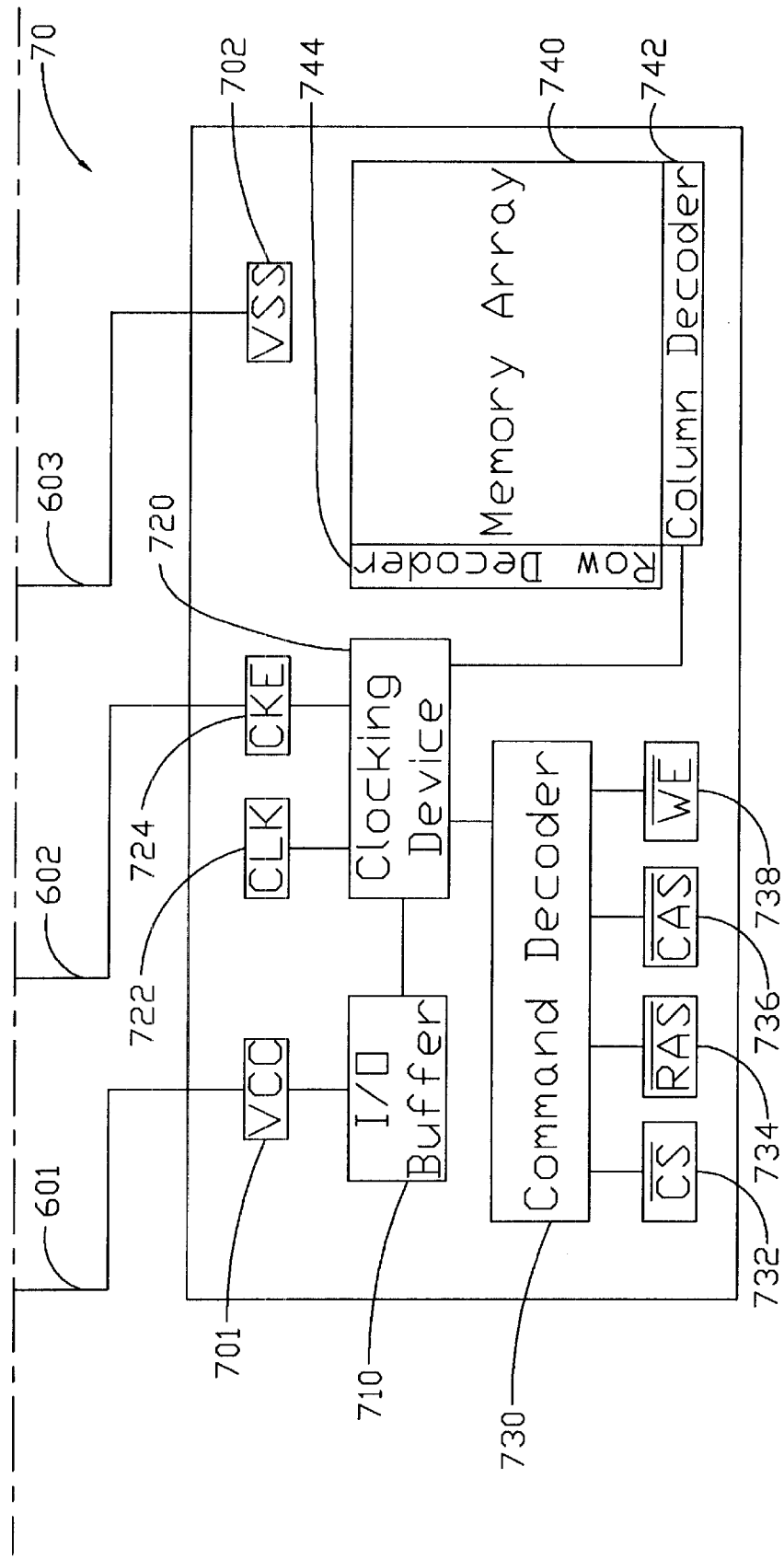
FIG. 4B shows a schematic top view of an example of internal circuitry within a die.

The internal probe pads 30 and 40 are connected to the internal circuitry 70 within the die 20 by interconnect, as shown in FIG. 4A and 4B. The first probe pad 30 and the second probe pad 40 are formed in the last metal layer 520. One or more conductive layers beneath the last metal layer 520 may be patterned to form one or more levels of interconnects vertically spaced from each other by one or more interlevel dielectric layers. As shown in FIG. 4A, a dielectric layer 530 is beneath the last metal layer 520, and a metal layer 540 is beneath the dielectric layer 530. There may be still other conductive layers or dielectric layers under the metal layer 540. Referring to FIG. 4A, the first conductive region 301 is connected to a VCC contact 701 through a first metal via 532, a first interconnect 542, and a first conductive path 601. The fourth conductive region 304 is connected to a CKE contact 724 through a second metal via 534, a second interconnect 544, and a second conductive path 602. The fifth conductive region 401 is connected to a VSS contact 702 through a third metal via 536, a third interconnect 546, and a third conductive path 603. A sixth conductive region 402 is connected to a fourth interconnect 548 by a fourth metal via 538.

In, addition, a passivation layer 510 may be deposited on the surface of teh last metal layer 520. A forst opening 512 is formed in the passivation layer 510 to explore the first probe pad 30, and a second opening is formed in the passivation layer to explore the second probe pad 40. The first probe 307 can contacts the first probe pad 30 through the first opening 512, and the second probe 407 can contacts the second probe pad 40 through the second opening 514.

In the present embodiment, the internal circuitry 70 within the die 20 is an example of memory device, as shown in FIG.4B. In addition to those contacts mentioned above, VCC (power), VSS (ground), CKE (clock enable), and CLK (system clock) 722, there are some useful contacts such as CS (chip select) 732, RAS (row address strobe) 734, CAS (column address strobe) 736, and WE (write enable) 738, and these contacts can also be connected in the same manner.

To conduct failure analysis, the circuitry of the die has to be placed into a certain mode. This can be done by connecting the first probe 307 to the first probe pad 30 and the second probe 407 to the second probe pad 40. And then the first probe 307 supplies signals to the circuitry through the first probe pad 30 and the second probe 407 is tied to ground. For example, the probe 307 supplies a voltage of 5V to the circuitry of die 20 so that VCC=5 V, CKE=5 V, CLK=5 V, and the second probe 407 is tied to ground so that VSS=0V.

In addition, the probe pads on the die 20 are arranged in a line in the present embodiment. However, this linear arrangement is not necessary, and the probe pads can also be arranged randomly. Each probe pad has at least 2 conductive regions, and in the present embodiment the probe pad 30 and 40 have 4 and 2 conductive regions respectively. Each conductive region can be connected to the same or different contacts of the internal circuitry 70 within the die 20, which is dependent on design. The shape of those conductive regions is not limited. They can be squares, circles, regular outline, or irregular outline. The arrangement of those conductive regions is also not limited. They may be distributed regularly or randomly.

Although specific embodiments have been illustrated and described, it will be obvious to those skilled in the art that various modifications may be made without departing from what is intended to be limited solely by the appended claims.

What is claimed is:

1. A device in a die for failure analysis, said device comprising:

a plurality of probe pads formed in a metal layer of said die, wherein each probe pad of said plurality of probe pads has a plurality of conductive regions, and each conductive region of said plurality of conductive regions is selectively connected to a contact of a circuitry within said die, and said circuitry can be placed into a mode by supplying signal to at least one probe pad of said plurality of probe pads.

2. The device according to claim 1, further comprising a multilevel interconnect structure through which said plurality of probe pads can be connected to contacts of said circuitry within said die.

3. The device according to claim 1, further comprising a passivation layer formed on the surface of said metal layer, and a plurality of openings are formed in said passivation layer to explore said plurality of probe pads.

4. The device according to claim 1, wherein said plurality of conductive regions are formed by etching.

5. The device according to claim 1, wherein the shape of said plurality of conductive regions is rectangular.

6. The device according to claim 1, wherein said plurality of conductive regions are connected to the same or different contacts of said circuitry within said die.

7. A device in a die for failure analysis, said device comprising:

a plurality of probe pads formed in a metal layer of said die, wherein each probe pad of said plurality of probe pads has a plurality of conductive regions, and each conductive region of said plurality of conductive regions is selectively connected to a contact of a circuitry within said die, and said circuitry can be placed into a mode by supplying signal to at least one probe pad of said plurality of probe pads; and a multilevel interconnect structure through which said plurality of probe pads can be connected to contacts of said circuitry within said die.

8. The device according to claim 7, further comprising a passivation layer formed on the surface of said metal layer, and a plurality of openings are formed in said passivation layer to explore said plurality of probe pads.

9. The device according to claim 7, wherein said plurality of conductive regions are formed by etching.

10. The device according to claim 7, wherein the shape of said plurality of conductive regions is rectangular.

11. The device according to claim 7, wherein said plurality of conductive regions are connected to the same or different contacts of said circuitry within said die.

* * * * *